(12) United States Patent
Cohn et al.

(10) Patent No.: US 7,095,063 B2
(45) Date of Patent: Aug. 22, 2006

(54) MULTIPLE SUPPLY GATE ARRAY BACKFILL STRUCTURE

(75) Inventors: John M. Cohn, Richmond, VT (US); Kevin M. Grosselfinger, South Burlington, VT (US); William F. Smith, Richmond, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 490 days.

(21) Appl. No.: 10/249,779

(22) Filed: May 7, 2003

(65) Prior Publication Data
US 2004/0222444 A1 Nov. 11, 2004

(51) Int. Cl.
*H01L 27/10* (2006.01)

(52) U.S. Cl. ............................................ 257/207
(58) Field of Classification Search ............ 257/202, 257/203, 206, 207, 208, 210, 211; 438/128, 438/129
See application file for complete search history.

(56) References Cited

U.S. PATENT DOCUMENTS

| | | | |
|---|---|---|---|
| 4,786,613 A | 11/1988 | Gould et al. | 438/48 |
| 5,051,917 A | 9/1991 | Gould et al. | 364/489 |
| 5,083,178 A * | 1/1992 | Otsu | 257/208 |
| 5,341,041 A | 8/1994 | El Gamal | 307/446 |
| 5,347,465 A | 9/1994 | Ferreri et al. | 364/488 |
| 5,369,595 A | 11/1994 | Gould et al. | 364/490 |
| 5,780,883 A * | 7/1998 | Tran et al. | 257/206 |
| 5,959,466 A | 9/1999 | McGowan | 326/39 |
| 6,025,737 A | 2/2000 | Patel et al. | 326/80 |
| 6,066,866 A | 5/2000 | Omori | 257/202 |
| 6,093,214 A | 7/2000 | Dillon | 716/17 |
| 6,107,836 A | 8/2000 | Kawahara et al. | 326/102 |
| 6,130,550 A | 10/2000 | Zaliznyak et al. | 326/39 |
| 6,144,241 A | 11/2000 | Wong | 327/202 |
| 6,239,612 B1 | 5/2001 | Shiflet | 326/39 |

OTHER PUBLICATIONS

Fox, B.C. and G.H. Seesing, "Flexible Voltage Distribution in Custom Semiconductor Circuit Chips," IBM Technical Disclosure Bulletin, vol. 20, No. 11A, Apr. 1978, pp. 4378-4379.

* cited by examiner

*Primary Examiner*—Long Pham
*Assistant Examiner*—Dana Farahani
(74) *Attorney, Agent, or Firm*—Richard A. Henkler, Esq.; Hoffman, Warnick & D'Alessandro LLC

(57) ABSTRACT

A multiple supply gate array structure facilitated by the provision of a shared n-well and an isolated n-well is described. The gate array structure allows implementation of a single voltage circuit or a multiple voltage circuit. In addition, the gate array structure allows metal reprogram to provide standard logic functions, or special logic functions such as a buffer function for a signal crossing a voltage island boundary. Other special logic functions may include, for example, a level-shifter function or a fence-hold function.

8 Claims, 3 Drawing Sheets

MULTIPLE SUPPLY GATE ARRAY BACKFILL STRUCTURE

BACKGROUND OF INVENTION

1. Technical Field

The present invention relates generally to application specific integrated circuits, and more particularly, to a multiple supply gate-array backfill structure.

2. Related Art

Application specific integrated circuits (ASIC) are designed by preparing a schematic layout specification in which structures are interconnected to form particular logical functions. The actual preparation may include using automated design software that provides, for example, synthesis, placement and routing of circuitry. For standard logical functions, libraries of cell structures exist that provide the necessary cell structures, which can be selected to generate the particular functions desired. Examples of functions include inverters, ANDs, NORs, etc. The design software places the appropriate cell structures in the ideal positions on the layout and then routes the structures together. Despite advanced design software packages, however, it is often necessary to modify the original layout after manufacture to address logic design problems. Unfortunately, preparing a full mask set that accommodates design modifications is expensive and creates long turnaround times prior to getting the fixed parts.

In order to address the modification problem, a number of techniques exist that take advantage of spaces on the integrated circuit (IC) that are not used to implement functions. These unused spaces exist in practically all ICs. One technique to allow for modifications is to provide spare circuits in the original layout and mask set. The spare circuits are spread throughout the IC design in the unused spaces, and are selected to provide a representative mix of functions. This technique, however, does not guarantee that the appropriate circuit will be available in the correct location when a modification is required.

Another technique that addresses design changes is to provide partially defined structures referred to herein as 'gate array backfill structures' that are placed in the unused space within the original layout and mask set. A modification can then be made by reprogramming the gate array backfill structures to perform a logic function. In one example, the gate array backfill structures are modified by a metal only modification. Modifications made using this technique are less expensive because they require minimal additional mask levels, and are faster because a full wafer processing is not required because the diffused layers may be processed ahead of the change, which only impacts the metal layers. A library of circuits, all of which use the same backfill cell for the diffused layers, but implement different logical functions requiring only metal changes, can be used to implement these modifications. Some techniques for providing gate array backfill cell structures are discussed in U.S. Pat. Nos. 5,369,595, 5,051,917 and 4,786,613.

Referring to FIG. 1, a conventional gate array backfill structure 14 is shown. Structure 14 includes a continuous n-well 18 that is shared by a number of transistors 16 and other adjacent circuitry (not shown). A voltage terminal 22 supplies the circuit voltage. The illustrative backfill structure 14 of FIG. 1 may be provided in an IC using a single voltage. In this case, the backfill structure 14 is limited to using the predetermined voltage of the IC and cannot be reprogrammed to accommodate a second, different voltage. Voltage islands are partitioned areas within an IC, each having a particular voltage supply. Voltage islands have found increasing usage because they allow for customization of power supply to different parts of an IC, which reduces power consumption.

Where voltage islands are used on an IC, backfill structure 14 may also be provided amongst the voltage islands. The use of voltage islands, however, presents a variety of problems relative to the conventional modification techniques discussed above. In particular, while typical gate array backfill cell structures 14 are usable to correct problems within voltage islands, they are unusable where an interconnection physically crosses over a voltage island or crosses a voltage island boundary because of the voltage differences involved. For example, if a voltage island is provided in the middle of an IC and a signal having nothing to do with the voltage island must physically cross the voltage island, the signal may need to be buffered. Unfortunately, it is impossible to place a buffer circuit into a voltage island in most cases because the buffer circuit up-level is referenced to the wrong voltage, i.e., the voltage of the voltage island. Accordingly, if a modification requires, for example, an interconnection of voltage islands or a signal inversion across a voltage island, current modification technology is incapable of implementation.

In view of the foregoing, a need exists for a gate array backfill cell structure that does not have the problems of the related art.

SUMMARY OF INVENTION

A multiple supply gate array structure facilitated by the provision of a shared n-well and an isolated n-well is described. The gate array backfill structure allows implementation of a single voltage or a multiple voltage circuit. The gate array backfill structure can be used to establish a voltage island and/or address modifications within a voltage island setting. In addition, the gate array structure allows metal reprogramming to provide standard logic functions, or special logic functions such as a buffer function for a signal crossing a voltage island boundary.

Other special logic functions may include, for example, a level-shifter function or a fence function such as a fence "1", fence "0" or fence hold.

A first aspect of the invention is directed to a gate array backfill structure for an integrated circuit, the structure comprising: a shared n-well; a first transistor set connected to the shared n-well; an isolated n-well; and a second transistor set connected to the isolated n-well.

A second aspect of the invention is directed to a gate array backfill structure for an integrated circuit, the structure comprising: a first transistor set connected to a first n-well; and a second transistor set connected to a second n-well, wherein the second n-well is isolated from the first n-well.

A third aspect of the invention is directed to a gate array backfill structure for an integrated circuit, the structure comprising: a first voltage domain having a first n-well and a first transistor set, each of the first n-well and the first transistor set connected to a first voltage terminal; and a second voltage domain having a second n-well that is isolated from the first n-well and a second transistor set, each of the second n-well and the second transistor set connected to a second voltage terminal, wherein the first voltage is different than the second voltage.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 2:
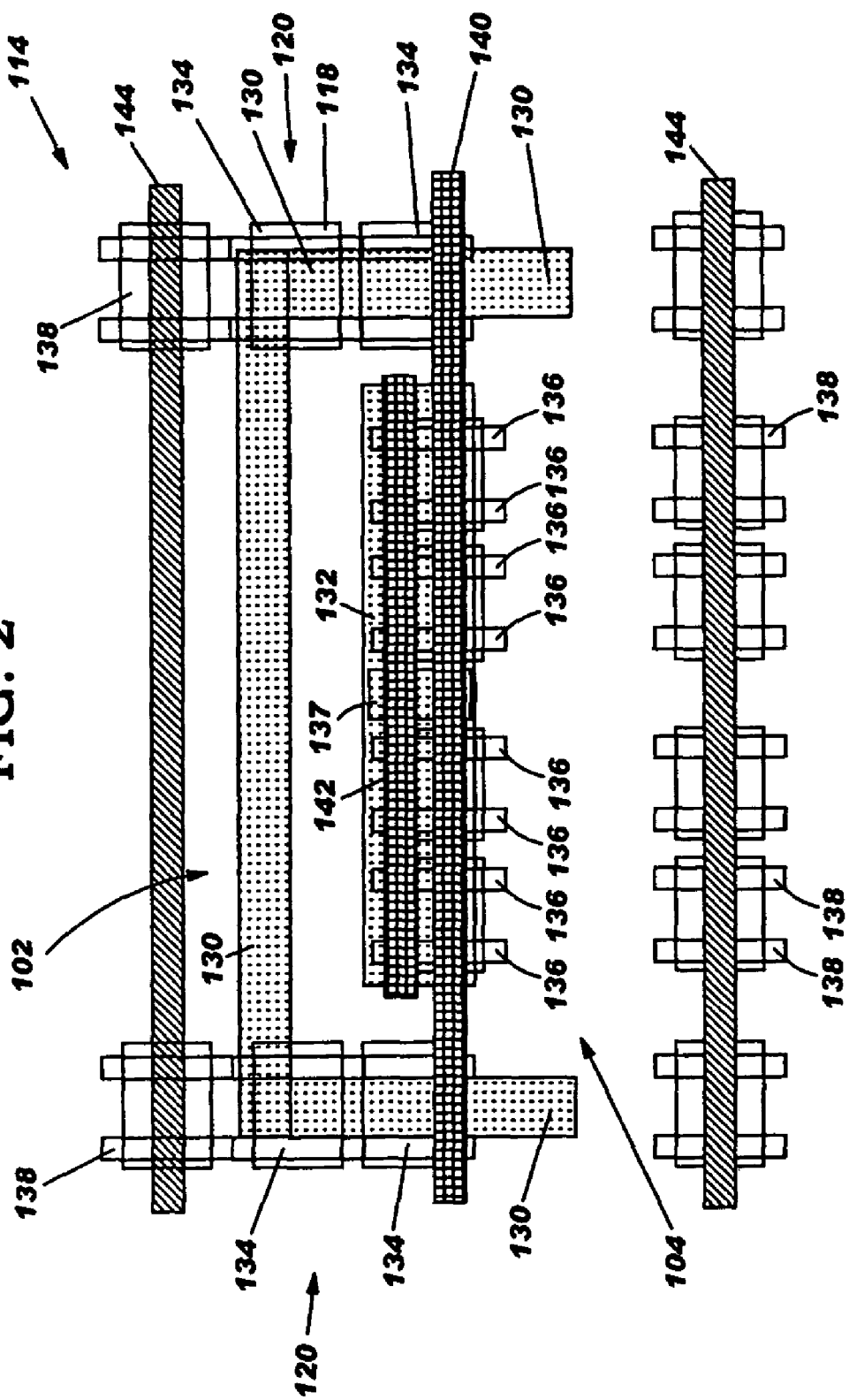
FIG. 2 shows a plan view of a gate array backfill structure of the invention.

With reference to the accompanying drawings, FIG. 2 shows a gate array backfill structure 114 (hereinafter backfill structure) of the invention. Backfill structure 114 is designed to be placed in unused space of an IC for implementing changes in IC function. Backfill structure 114 includes a first voltage domain 102 and a second voltage domain 104. First voltage domain 102 includes a shred n-well 130 that is shared between every two adjacent rows on boundaries 120, and a first transistor set 134 built upon and connected to shred n-well 130. Second voltage domain 104 includes an isolated n-well 132 that is not shared between two adjacent rows on boundaries 120, and is isolated from shared n-well 130, and a second transistor set 136 built upon and connected to isolated n-well 132. A first voltage terminal 140 extends over both shared n-well 130 and isolated n-well 132, and is connected to at least shared n-well 130 (interconnection to n-well 130 not shown for clarity). A second voltage terminal 142 also extends over isolated n-well 132. A well contact 137 is shown between isolated n-well 132 and one of voltage terminal 140, 142.

Figure 3:
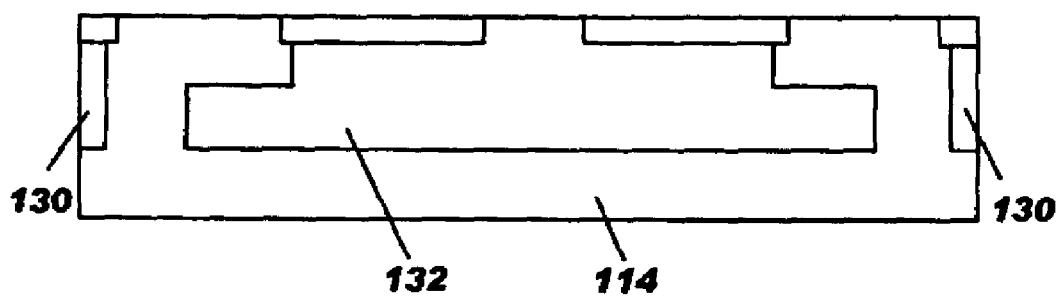
FIG. 3 shows cross-sectional side view of the gate array backfill structure of FIG. 2.

Both shared n-well 130 and isolated n-well 132 are buried wells. Isolated n-well 132 is separated from shared n-well 130 horizontally as shown in FIG. 3. Each voltage domain 102, 104 can be programmed to provide any logical function that a designer constructs them to design. Other transistor sets 138 may be coupled to one or more ground terminals 144. Each transistor set 134, 136, 138 includes at least one transistor.

In one embodiment, each voltage terminal 140, 142 is provided at a first metal layer of the IC. In this way, first voltage terminal 140 and second voltage terminal 142 are each selectively connectable to isolated n-well 132 and/or second transistor set 136, depending on the function desired. That is, isolated n-well 132 and/or second transistor set 136 can be programmed during a modification to be connected, via interconnection 137, to either first voltage terminal 140 or second voltage terminal 142. First voltage terminal 140 is connected to shared n-well 130 and/or first transistor set 134, depending on the function desired. In any case, the first voltage and the second voltage are different. "Different" as used herein relative to the voltages means that the voltages either have unequal values when active, or have equal values but are not active at the same time. Circuitry on the boundaries 120 of the backfill structure 114 still share shared n-well 130 with the rest of the CMOS device (not shown). It should be recognized that duplication of voltage terminals 140, 142 and ground terminals 144 may also be provided.

The above-described gate array backfill structure 114 provides a number of advantages. First, gate array backfill structure 114 allows a wide variety of voltage settings. For example, backfill structure 114 allows establishment of a single voltage circuit by programming an interconnection to only first voltage terminal 140. Alternatively, backfill structure 114 allows establishment of a new voltage island within an otherwise uniform voltage IC, or establishment of a multiple voltage area by programming an interconnection between second set of transistors 136 and second voltage terminal 142, and an interconnection between first set of transistors 134 and first voltage terminal 140. Second, backfill structure 114 can be used to address modifications within a voltage island setting. For example, an interconnection (e.g., first voltage terminal 140) to one of shared n-well 130 and isolated n-well 132 may cross a voltage island boundary or an entire voltage island. Third, the provision of isolated n-well 132 lends itself to providing a number of special logic functions.

Figure 4:
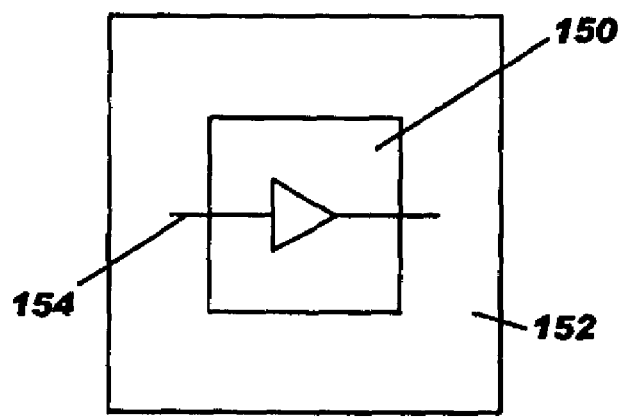
FIG. 4 shows a schematic view of buffering a signal crossing a voltage island boundary.

First, in one embodiment, second transistor set 136, i.e., the one connected to the second voltage terminal 142, may be programmed to provide a buffer function. In this way, as shown in FIG. 4, when backfill structure 114 is implemented where a voltage island 150 is placed in the middle of an IC 152, and a signal 154 having nothing to do with voltage island 150 must physically cross the voltage island, signal 154 can be buffered by powering second set of transistors 136 with a voltage that the signal is referenced to. In other words, backfill structure 114 provided within voltage island 150 can create a buffer function for signal 154 referenced to a voltage other than that of voltage island 150, e.g., the voltage of first set of transistors 134.

Second, in another embodiment, second transistor set 136 may be programmed to provide a level-shifter function. Level shifting includes a translation of a logical signal referenced to the voltage outside of a voltage island, based on power supply voltages inside and outside of the voltage island and logical signals inside the voltage island, to reference the voltage on the inside of the voltage island, or vice versa. For instance, where a logical signal outside of a voltage island is referenced to the outside voltage, the signal can be level shifted to reference the island voltage, i.e., anywhere from ground (logic 0) to the inside VDD (logic 1). Similarly, second set of transistors 136 may also translate the logical signal to reference the outside voltage supply rather than the inside voltage supply for output from the voltage island.

Third, in yet another embodiment, second transistor set 136 may be programmed to provide a fence function such as a fence "1", fence "0" or fence hold. A fence function is one in which a state of logic that you are powering off is forced to 1, 0 or held at a current state. The state is then directed to downstream logic such that the downstream logic receives valid data despite the particular upstream logic being powered off. In other words, a fence function prevents invalid data from being delivered to downstream logic, which may invalidate the downstream logic output.

While three special logic functions have been disclosed and described, it should be recognized that the multiple supply gate array backfill structure described herein may lend itself to provision of other special logic functions not expressly described herein.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

Figure 1:
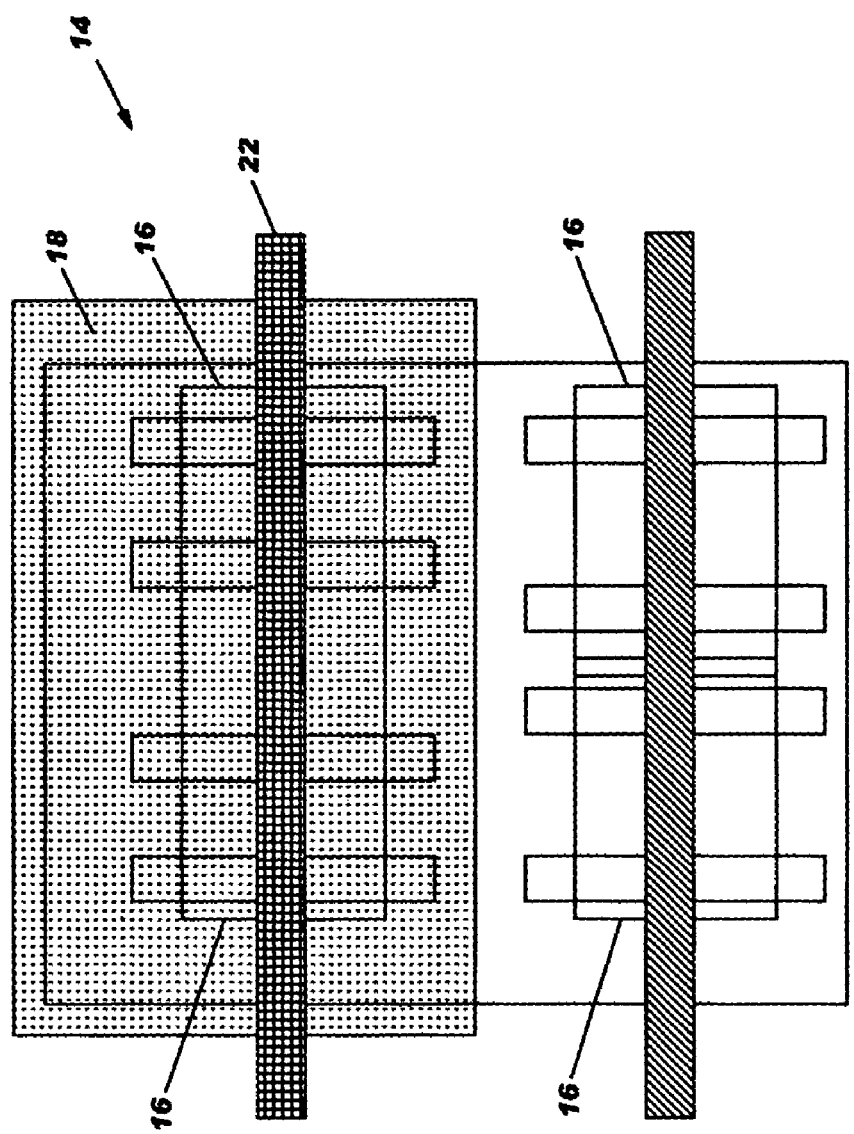
FIG. 1 shows a plan view of a conventional gate array backfill structure.

For example, gate array backfill structure 14 may be intermixed with conventional backfill structures such as those shown in FIG. 1. Intermixing may be advantageous because conventional backfill structures may be implemented with denser circuitry and with reduced power draw and costs.

What is claimed is:

1. A gate array backfill structure for an integrated circuit, the structure comprising:
   a first voltage domain having a first n-well and a first transistor set, each of the first n-well and the first transistor set connected to a first voltage terminal;
   a second voltage domain having a second n-well that is contained within boundaries of a cell and is isolated from the first n-well and a second transistor set, each of the second n-well and the second transistor set connected to one of first voltage terminal and a second voltage terminal,
   wherein the first voltage terminal and the second voltage terminal supply a substantially constant voltage; and
   a ground voltage terminal,
   wherein the first voltage is different than the second voltage, and the ground voltage is different than both the first and the second voltage.

2. The structure of claim 1, wherein an interconnection to one of the first n-well and the second n-well crosses a voltage island boundary.

3. The gate array backfill structure of claim 1, wherein the second n-well is connected to the second voltage terminal.

4. The gate array backfill structure of claim 1, wherein the second transistor set is connected to the second voltage terminal.

5. The gate array backfill structure of claim 1, wherein the second voltage domain provides a buffer function.

6. The gate array backfill structure of claim 1, wherein the second voltage domain provides a level-shifter function.

7. The gate array backfill structure of claim 1, wherein the second voltage domain provides a fence function.

8. The gate array backfill structure of claim 1, wherein each voltage terminal is provided at a first metal layer of the integrated circuit.

* * * * *